United States Patent
Tsai et al.

(10) Patent No.: US 7,155,619 B2
(45) Date of Patent: Dec. 26, 2006

(54) APPARATUS FOR RESETTING AN IC OF A SEPARABLE EXTENSIVE ACCESSORY BASED ON CONNECTION STATUS OF AN EXTERNAL PORTABLE DEVICE TO THE ACCESSORY

(75) Inventors: Raymond Tsai, TaoYuan (TW); Tyrancy Wan, TaoYuan (TW); Jiunn Yau Huang, TaoYuan (TW)

(73) Assignee: High Tech Computer Corp., TaoYuan (TW)

( * ) Notice: Subject to any disclaimer, the term of this patent is extended or adjusted under 35 U.S.C. 154(b) by 399 days.

(21) Appl. No.: 10/651,983

(22) Filed: Sep. 2, 2003

(65) Prior Publication Data

US 2004/0056694 A1   Mar. 25, 2004

(30) Foreign Application Priority Data

Sep. 24, 2002 (TW) ............................... 91121800 A

(51) Int. Cl.
*G06F 1/26* (2006.01)
(52) U.S. Cl. ................. 713/320; 713/300; 713/340
(58) Field of Classification Search ......... 713/300, 713/340, 320
See application file for complete search history.

(56) References Cited

U.S. PATENT DOCUMENTS

| 4,638,396 | A | * | 1/1987 | Mukli et al. ................. 361/101 |
| 5,031,142 | A | * | 7/1991 | Castro ........................ 365/49 |
| 5,659,508 | A | * | 8/1997 | Lamphier et al. ........... 365/201 |
| 6,049,143 | A | * | 4/2000 | Simpson et al. ............. 307/126 |
| 6,778,066 | B1 | * | 8/2004 | Smith ......................... 340/5.61 |
| 2001/0032279 | A1 | * | 10/2001 | Noda et al. .................. 710/105 |
| 2003/0133329 | A1 | * | 7/2003 | Satoh ..................... 365/185.22 |
| 2004/0212408 | A1 | * | 10/2004 | Indoh ......................... 327/143 |
| 2005/0033894 | A1 | * | 2/2005 | Haupt et al. ................. 710/310 |
| 2005/0035796 | A1 | * | 2/2005 | Chun et al. .................. 327/143 |

\* cited by examiner

*Primary Examiner*—Thomas Lee
*Assistant Examiner*—Malcolm Cribbs
(74) *Attorney, Agent, or Firm*—Troxell Law Office, PLLC

(57) ABSTRACT

A resetting device, of a separable extensive accessory, connected between a portable device and an IC arranged in a separable extensive accessory. By using a simple logic circuit, the resetting device will complete the resetting action of the IC arranged on the extensive accessory when the connecting relationship between the separable extensive accessory and the portable device is changed.

22 Claims, 8 Drawing Sheets

APPARATUS FOR RESETTING AN IC OF A SEPARABLE EXTENSIVE ACCESSORY BASED ON CONNECTION STATUS OF AN EXTERNAL PORTABLE DEVICE TO THE ACCESSORY

FIELD OF THE INVENTION

The invention relates to a resetting device, and in particular to a resetting device that is arranged in a separable extensive accessory.

BACKGROUND OF THE INVENTION

Multi-functional portable devices, such as: personal digital assistant (PDA), portable communication products, etc., have already become indispensable tools in our daily lives. However, in order to extend the convenience and the function of portable device, the resetting action of the IC arranged in the extensive accessory must be accurately completed when the relationship with the matched separable extensive accessory is changed (i.e., pulling out/inserting in), such that the entire system may operate normally.

When the separable extensive accessory processes the pulling-out/inserting-in actions to the portable device, there are two kinds of resetting manner to the IC arranged in the extensive accessory. First kind: by a resetting signal provided by the portable device, the IC is reset through the state transition of the signal. FIG. 1 is an illustration for the embodiment according to this kind of prior art. In FIG. 1, the portable device 10 has a resetting device 40, which may provide a resetting signal to the IC 30 in the separable extensive accessory 20 to complete the resetting action of the IC 30. However, since it has to additionally arrange a resetting device 40 in the portable device 10, so it reduces the available space and resource of the portable device 10.

FIG. 2A is an illustration of the embodiment of the second kind of prior art. It is possible to arrange a RC circuit 50 in the separable extensive accessory. The capacitance C is short-circuited to ground when the switch of the power source VCC is opened, such that an action to pull-down a signal from high to low is generated. By further applying a charging action to the capacitance C by the power source VCC, the signal is raised to high to end the resetting action of the IC 30. However, when using this kind of prior art, it must be sure that the power source VCC is in closed state and the capacitance C has already discharged completely before the separable extensive accessory 20 is inserted into the portable device 10. In addition, when the pulling-out/inserting-in actions between the separable extensive accessory 20 and the portable device 10 are executed continuously during short period, a mistake of the separable extensive accessory 20 may be occurred to cause the system unable to operate normally because of the problems of stability and transient state. FIG. 2B is a wave diagram of the resetting signal generated by the resetting device of FIG. 2A.

Therefore, aiming to the shortcomings of above prior arts, a resetting device for separable extensive accessory is proposed; when the connecting relationship between the separable extensive accessory and the portable device is changed, the resetting action of the IC arranged in the separable extensive accessory may be completed, and this is the emphasis of the present invention.

SUMMARY OF THE INVENTION

The main objective of the present invention is to provide a resetting device, for s eparable extensive accessory, applying a simple logic circuit, which may complete the resetting action of the IC arranged in the separable extensive accessory when the connecting relationship between the separable extensive accessory and the portable device is change without arranging any resetting circuit in the portable device to prevent the consumption of the resources of the portable device Another objective of the present invention is to provide a resetting device, for s eparable extensive accessory, applying a simple logic circuit, which may complete the resetting action of the IC arranged in the separable extensive accessory when the connecting relationship between the separable extensive accessory and the portable device is changed quickly without the influence of power source or other transient state.

In order to achieve above objectives, the invention discloses a resetting device, for separable extensive accessory, being connected between an external portable device and an IC, for providing power source, arranged in the separable extensive accessory, wherein the resetting device includes: an input buffering circuit, which is connected to the power source and is connected to the external portable device by a detachable manner, and which may generate a signal state transition in corresponding to the change of the connecting relationship between the separable extensive accessory and the portable device; a impulse generating circuit, which is connected to the input buffering circuit for receiving the signal state transition and outputting a impulse signal; and a resetting signal generating circuit, which is connected to the power source and the impulse generating circuit for receiving the impulse s ignal and outputting a resetting s ignal t o the IC. The resetting device according to the invention may also includes: a reset deciding circuit, which is connected to the impulse generating circuit for deciding if the impulse generating circuit generates an impulse signal.

For your esteemed member of reviewing committee to further recognize and understand the characteristics, objectives, and functions of the present invention, a detailed description together with corresponding drawings are presented thereinafter.

DETAILED DESCRIPTION OF THE INVENTION

A detailed description concerning the resetting device, for separable extensive accessory, disclosed by the invention is referred by the following embodiments and corresponding drawings for further understanding its objectives, functions, and structures, wherein same referential numbers will denote the same elements.

Figure 1:
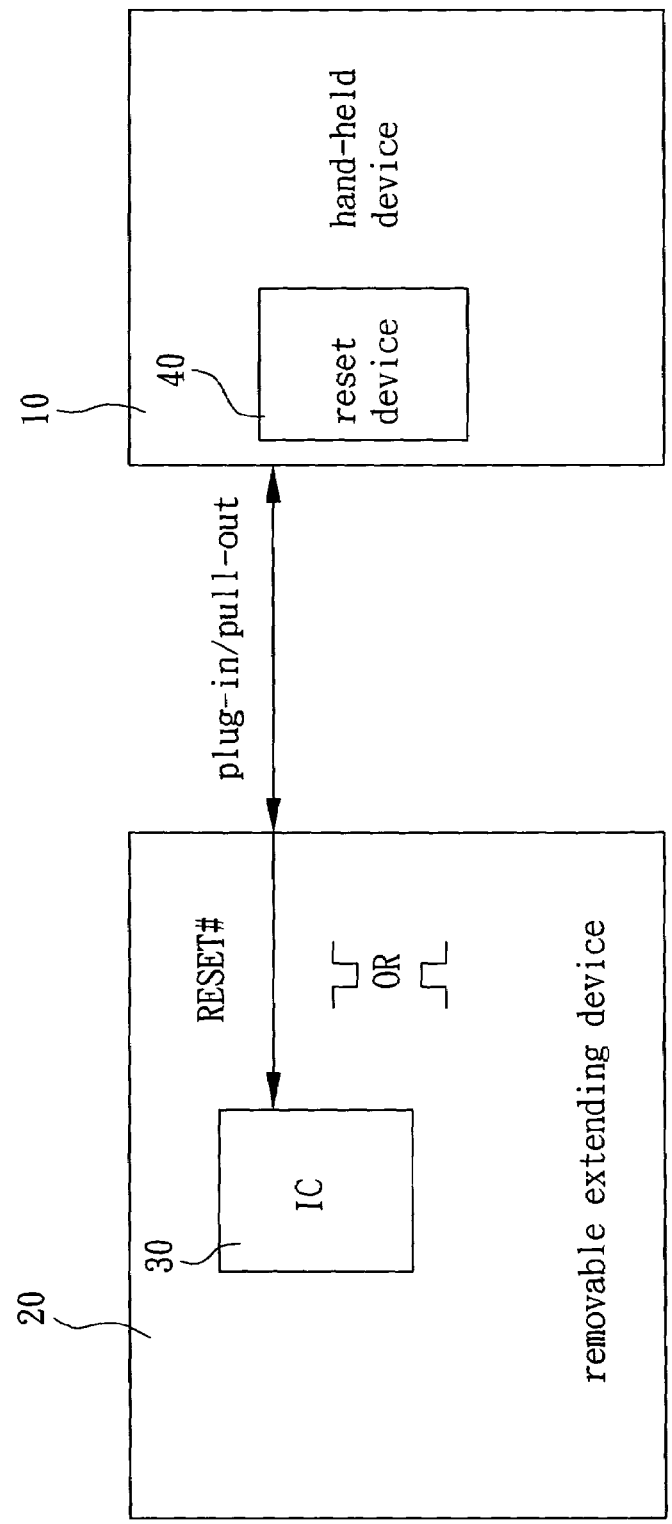
FIG. 1 is an illustration for the connecting relationship between the separable extensive accessory and the portable device according to a prior art.
Figure 2A:
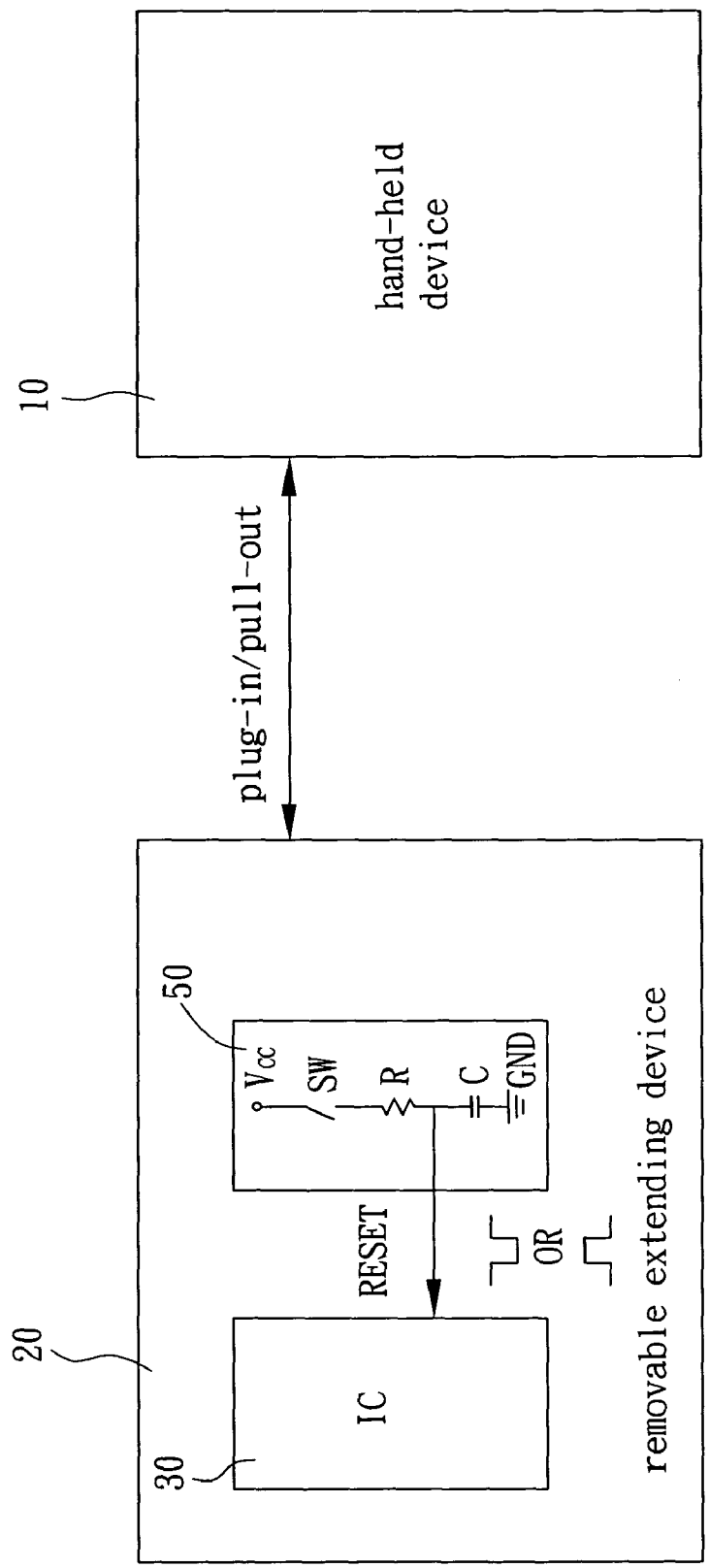
FIG. 2A is an illustration for the connecting relationship between the separable extensive accessory and the portable device according to another prior art.
Figure 2B:
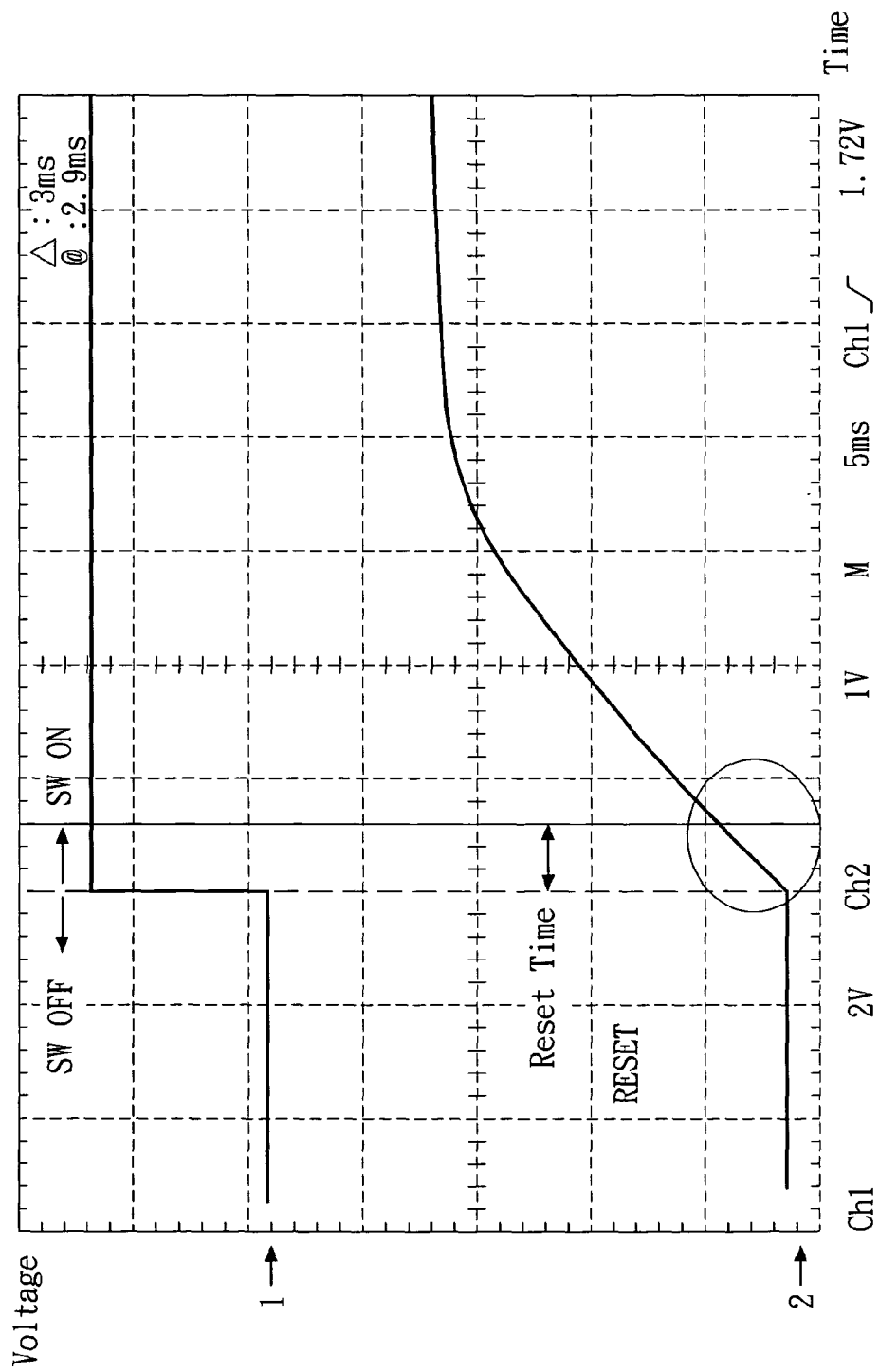
FIG. 2B is a wave diagram of the resetting signal generated by the RC circuit of FIG. 2A.
Figure 3:
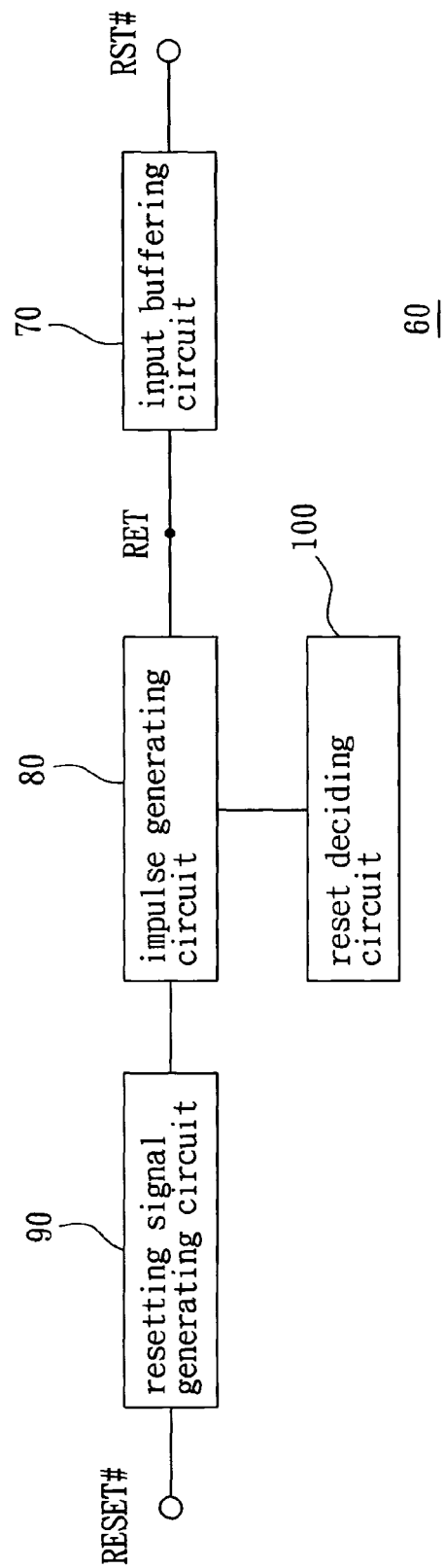
FIG. 3 is an illustrating block diagram for the resetting device according to the invention.

According to the invention, the resetting device for separable extensive accessory is connected between an external portable device and an IC, for providing power source, arranged in a separable extensive accessory. FIG. 3 is an illustrating block diagram for the resetting device according to the invention. The resetting device 60 includes: an input buffering circuit 70, which is connected to power source and is connected to an external portable device by a detachable manner, and which may generate signal state transition and output reversing signal state transition, such as: high-to-low transition or low-to-high transition, corresponding to the change of the connecting relationship (i.e., pulling-out/ inserting in) between the separable extensive accessory and the portable device; an impulse generating circuit 80, which is connected to the input buffering circuit 70 for receiving the reversing signal state transition to further generate impulse signal; and a resetting signal generating circuit 90, which is connected to the power source and the impulse generating circuit 80 for receiving the impulse signal and outputting resetting signal (RESET#) to the IC arranged in the separable extensive accessory.

The resetting device according to the invention may further include a reset deciding circuit 100 that is connected to the impulse generating circuit 80 for deciding if the impulse generating circuit 80 generates impulse signal.

There are different implementing manners for the connection of the detailed circuit according to different actual requirements, so three preferable embodiments are presented for the purpose of description.

[First Embodiment]

Figure 4A:
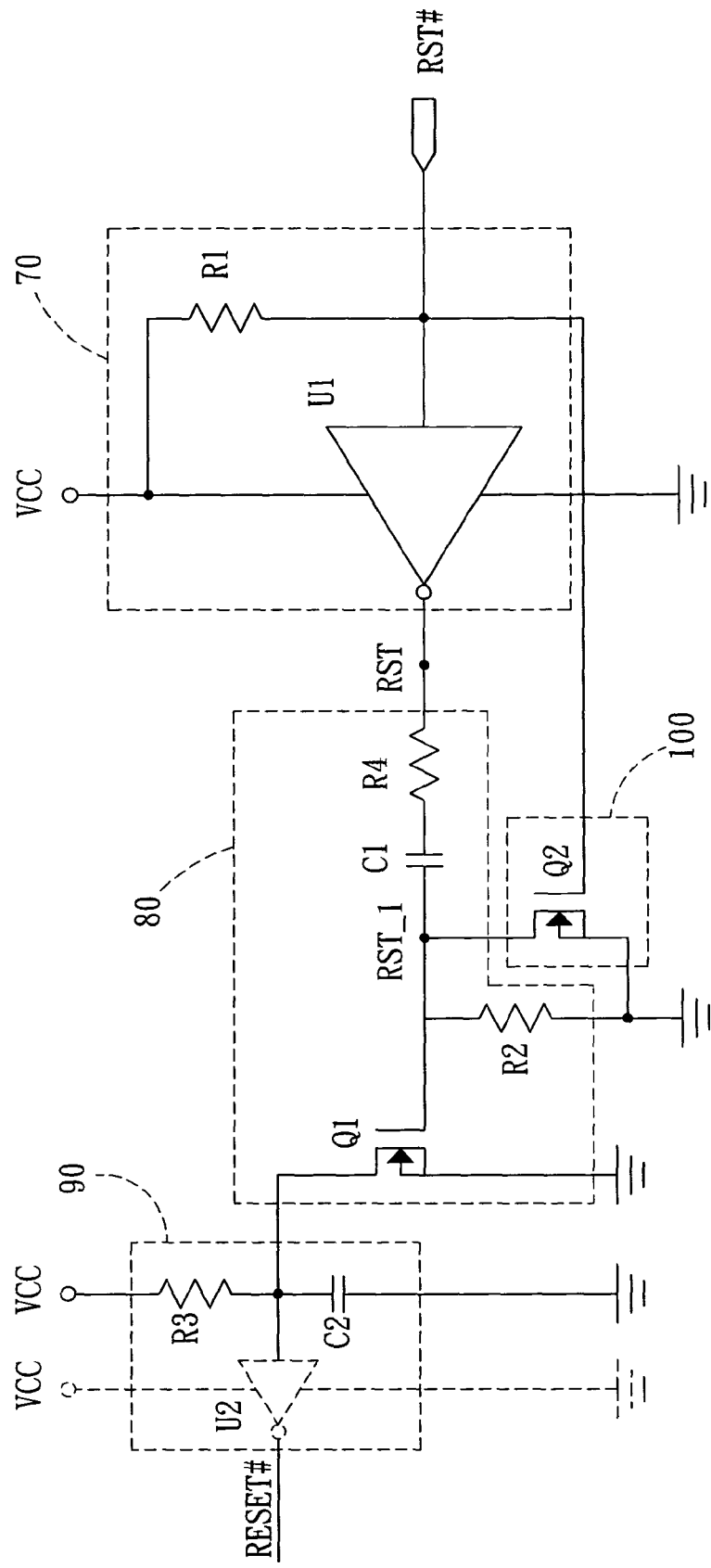
FIG. 4A is a detailed circuit diagram of the resetting device according to the first embodiment of the present invention.

Please refer to FIG. 4A, which is a detailed circuit diagram for the resetting device according to the first embodiment of the invention. The resetting device according to this embodiment includes: input buffering circuit 70; impulse generating circuit 80; resetting signal generating circuit 90; and reset deciding circuit 100. Wherein, the reset deciding circuit 100 will make the impulse generating circuit 80 generate a impulse signal when the separable extensive accessory is inserted into the external portable device and will make the impulse generating circuit 80 unable to generate any impulse signal when the separable extensive accessory is pulled out of the external portable device, such that the resetting signal generating circuit 90 will generate a resetting signal when the separable extensive accessory is inserted into the external portable device and will not generate any resetting signal when the separable extensive accessory is pulled out of the external portable device.

To achieve above functions, a detailed circuit for implementing the resetting device according to the invention is presented as follows. Wherein, the input buffering circuit 70 includes: a first reverser U1, which is connected to a power source VCC, and of which the input side is the input side of the input buffering circuit 70, and of which the output side is the output side of the input buffering circuit 70; and a first resistance R1, which is connected between the power source VCC and the input side of the first reverser U1. The impulse generating circuit 80 includes: a first capacitance C1, of which the first side is connected to the output side of the first reverser U1; a second resistance R2, of which the first side is connected to the second side of the first capacitance C1, and of which the second side is grounded; and a first transistor Q1, which is a N-channel MOSFET, and of which the gate side is connected to the second side of the first capacitance C1, and of which the source side is grounded. The resetting signal generating circuit 90 includes: a third resistance R3, of which the first side is connected to the power source VCC, and of which the second side is connected to the draw side of the first transistor Q1; a second capacitance C2, of which the first side is connected to the second side of the third resistance R3, and of which the second side is grounded; and a resetting signal o utputting side, which is l ocated b etween the t hird capacitance R3 and the second capacitance C2 for outputting the resetting signal. The reset deciding circuit 100 includes: a second transistor Q2, which is a N-channel MOSFET, and of which the gate side is connected to the input side of the first reverser U1, and of which the draw side is connected to the second side of the first capacitance C1, and of which the source side is grounded.

Preferably, t he impulse generating c ircuit 80 further i ncludes a fourth resistance R4 connected between the first side of the first capacitance C1 and the output side of the first reverser U1. The purpose of the fourth resistance R4 is to control the current passing through the impulse generating circuit 80.

Consequently, when the separable extensive accessory is inserted into the portable device, the RST# signal of high state originally maintained by the first resistance R1 will be pulled down to low state by the GND (ground) side of the portable device, such that a signal state transition (i.e., high-to-low transition) is generated. The first reverser U1 will reverse the signal state transition and output it. Now, RST is in high state. Because of the characteristic of the transient short-circuit of the first capacitance C1, RST_1 is transited to high state transiently to make the transistor Q1 conducted, then the RESET# is grounded through the first transistor Q1 to make its state become low. Next, the RST_1 of the second side of the first capacitance C1 will be discharged through the second resistance R2. When the voltage of the RST_1 is lower than the critical voltage ($V_T$) of the first transistor Q1, the first transistor Q1 will be cut off to make the voltage of the RESET# raise to high state gradually by following the charge, of the second capacitance, executed by the power source VCC through the third resistance R3, such that a resetting signal of low state is completed. The resetting signal of low state may be further output to the IC arranged in the separable extensive accessory to complete the resetting action of the IC.

Figure 4B:
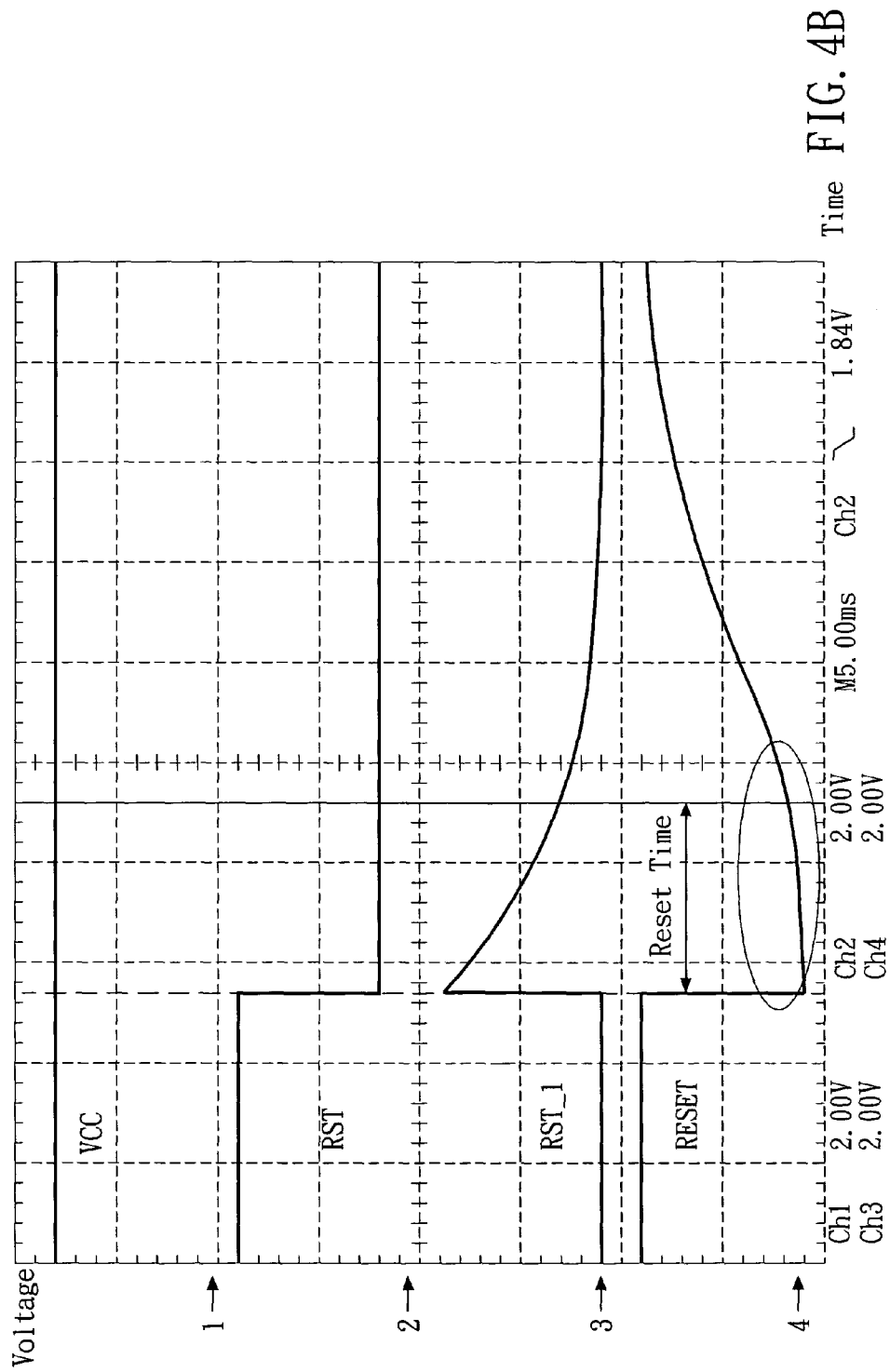
FIG. 4B is a wave diagram of the resetting signal generated by the resetting device of FIG. 4A when the separable extensive accessory is inserted into the portable device.

To further verify the function of the present embodiment, please refer to FIG. 4B, which is a wave diagram of the resetting signal generated by the resetting device of FIG. 4A when the separable extensive accessory is inserted into the portable device. The resetting time of the RESET# is about 15 ms.

If the IC arranged in the separable extensive accessory may execute the resetting action only by the resetting signal of high state, then a second reverser U2 may be added at the resetting signal outputting side in the resetting signal generating circuit 90 to change the resetting signal of low sate into the resetting signal of high state.

When the separable extensive accessory is pulled out of the portable device, due to the GND (ground) of the portable device, the RST# signal maintained in low state originally will be pulled up to high state by the power source VCC through a first resistance R1 to make the second transistor Q2 conducted. Now, the RST_1 is grounded through the second transistor Q2 to make the transistor Q1 cut off to be unable to generate any resetting signal.

Consequently, in the present embodiment, the resetting device disclosed by the invention will generate resetting signal when the separable extensive accessory is inserted into the external portable device and will not generate any resetting signal when the separable extensive accessory is pulled out of the external portable device.

[Second Embodiment]

Figure 5:
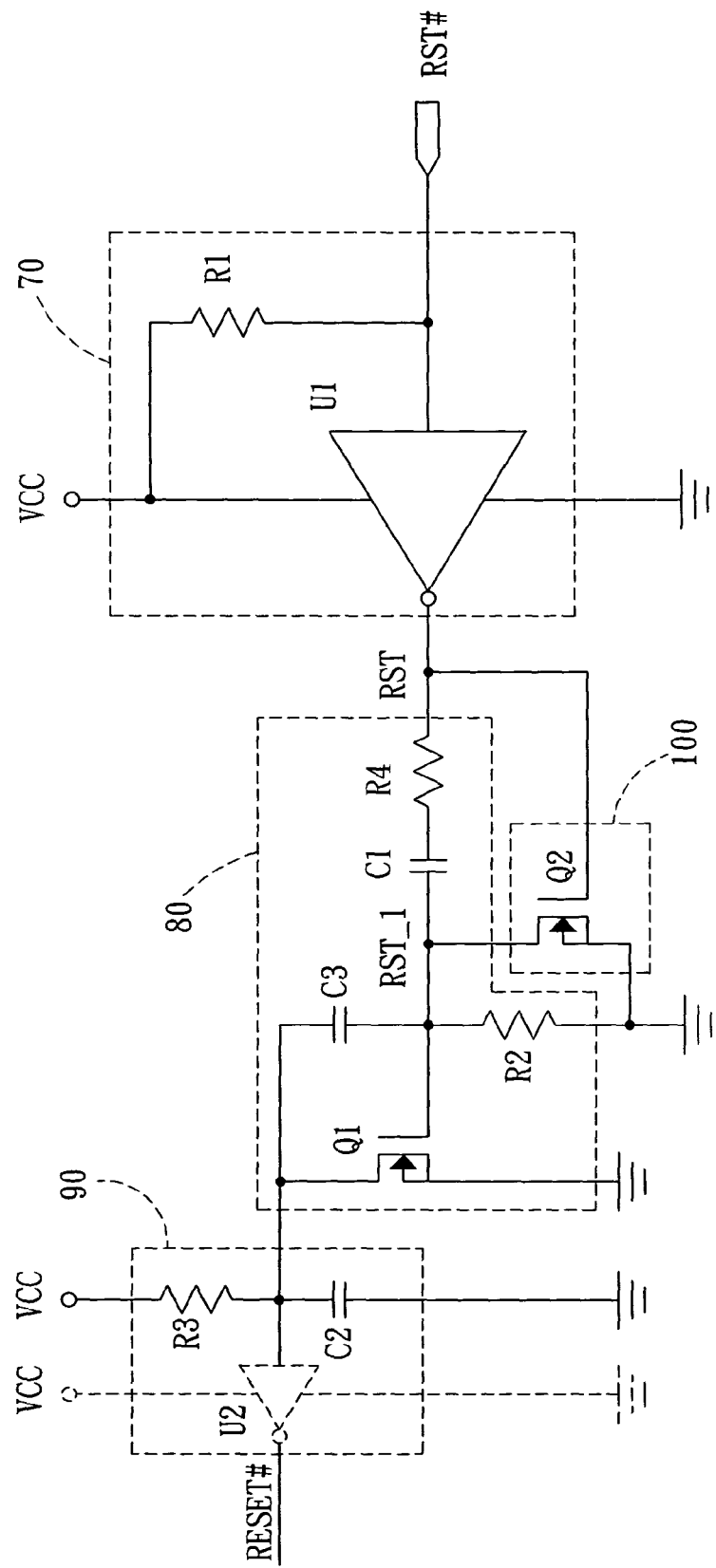
FIG. 5 is a detailed circuit diagram of the resetting device according to the second embodiment of the present invention.

Please refer to FIG. 5, which is a detailed circuit diagram for the resetting device according to the second embodiment of the invention. The resetting device according to this embodiment includes: input buffering circuit 70; impulse generating circuit 80; resetting signal generating circuit 90; and reset deciding circuit 100. Wherein, the reset deciding circuit 100 will make the impulse generating circuit 80 unable to generate a impulse signal when the separable extensive accessory is inserted into the external portable device and will make the impulse generating circuit 80 generate a impulse signal when the separable extensive accessory is pulled out of the external portable device, such that the resetting signal generating circuit 90 will not generate any resetting signal when the separable extensive accessory is inserted into the external portable device and will generate resetting signal when the separable extensive accessory is pulled out of the external portable device.

To achieve above functions, a detailed circuit for implementing the resetting device according to the invention is presented as follows. Wherein, since the input buffering circuit 70 and the resetting signal generating circuit 90 are same as those of the first embodiment, so they are not repetitiously described herein. In the impulse generating circuit 80, a third capacitance C3 that is additional to the impulse generating circuit in the first embodiment is further included and its first side is connected to the second side of the first capacitance C1, while its second side is connected to the draw side of the first transistor Q1. In addition, the reset deciding circuit 100 also includes a second transistor Q2; however, its gate side is connected to the output side of the input buffering circuit.

Consequently, when the separable extensive accessory is inserted into the portable device, the RST# signal of high state maintained by the first resistance R1 will be pulled down to low state by the GND (ground) side of the portable device, such that a signal state transition (i.e., high-to-low transition) is generated. The first reverser U1 will reverse the state transition and output it. Now, RST is in high state to make the second transistor Q2 conducted, such that the second transistor Q2 is grounded through the second transistor Q2. In the meantime, the first transistor Q1 is cut off to be unable to generate any resetting signal.

When the separable extensive accessory is pulled out of the portable device, the RST# signal of low state maintained originally by the GND (ground) side of the portable device will be pulled up to high state by the power source VCC through the first resistance R1, such that a signal state transition is generated. The first reverser U1 will reverse the state transition. Now, RST is in low state to cut off the second resistor Q2. Because of the characteristic of the transient short-circuit of the first capacitance C1, RST_1 is transited to negative voltage transiently to make the transistor Q1 cut off. Because of the characteristic of the transient short-circuit of the third capacitance C3, the voltage of current RESET# will be pulled down to low state. Next, the voltage of the RESET# will raise to high state gradually by following the charge, of the second capacitance, executed by the power source VCC through the third resistance R3, such that a resetting signal of low state is completed. The resetting signal of low state may be further output to the IC arranged in the separable extensive accessory to complete the resetting action of the IC.

As described in the first embodiment, if the IC arranged in the separable extensive accessory may execute the resetting action only by the resetting signal of high state, then a second reverser U2 may be added at the resetting signal outputting side in the resetting signal generating circuit 90 to change the resetting signal of low sate into the resetting signal of high state.

Consequently, in the present embodiment, the resetting device disclosed by the invention will not generate any resetting signal when the separable extensive accessory is inserted into the external portable device and will generate resetting signal when the separable extensive accessory is pulled out of the external portable device.

[Third Embodiment]

Figure 6:
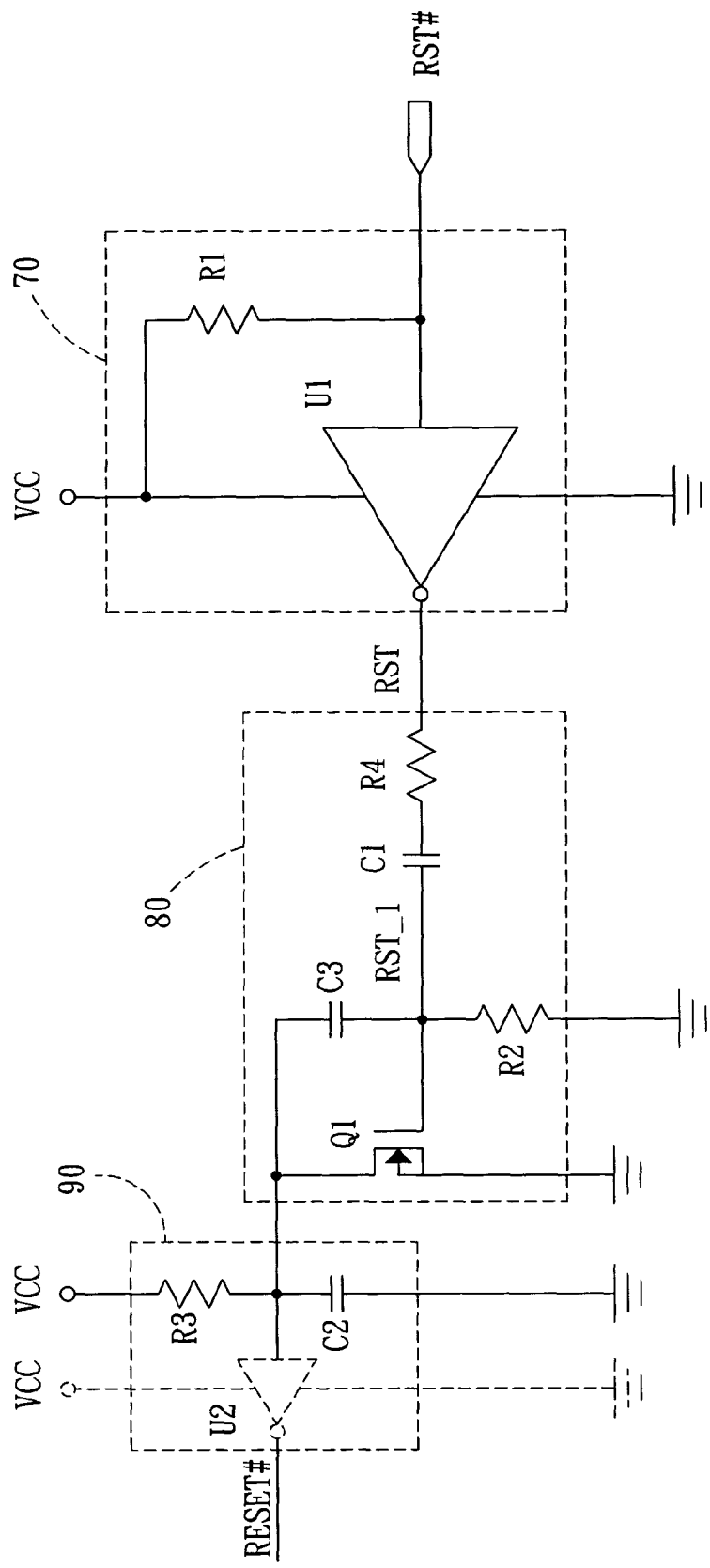
FIG. 6 is a detailed circuit diagram of the resetting device according to the third embodiment of the present invention.

Please refer to FIG. 6, which is a detailed circuit diagram for the resetting device according to the third embodiment of the invention. The resetting device according to this embodiment includes: input buffering circuit 70; impulse generating circuit 80; and resetting signal generating circuit 90. Wherein, the resetting signal generating circuit 90 will generate resetting signal when the separable extensive accessory is inserted into the external portable device and will also generate resetting signal when the separable extensive accessory is pulled out of the external portable device.

To achieve above functions, a detailed circuit for implementing the resetting device according to the invention is presented as follows. Wherein, since the input buffering circuit 70, the impulse generating circuit 80, and the resetting signal generating circuit 90 are same as those of the first embodiment, so they are not repetitiously described herein. The major difference between third embodiment and the first and second embodiments is that the third embodiment has no reset deciding device, so no matter when the separable extensive accessory is inserted into the external portable device or the separable extensive accessory is pulled out of the external portable device, resetting signal will all be generated.

Consequently, when the separable extensive accessory is inserted into the portable device, the RST# signal of high state originally maintained by the first resistance R1 will be pulled down to low state by the GND (ground) side of the portable device, such that a signal state transition (i.e., high-to-low transition) is generated. The first reverser U1 will reverse the state transition and output it. Now, RST is in high state. Because of the characteristic of the transient short-circuit of the first capacitance C1, RST_1 is transited to high state transiently to make the transistor Q1 conducted, then the RESET# is grounded through the first transistor Q1 to make its state become low. Next, the RST_1 of the second side of the first capacitance C1 will be discharged through the second resistance R2. When the voltage of the RST_1 is lower than the critical voltage (VT) of the first transistor Q1, the first transistor Q1 will be cut off to make the voltage of the RESET# raise to high state gradually by following the charge, of the second capacitance, executed by the power source VCC through the third resistance R3, such that a resetting signal of low state is completed. The resetting signal of low state may be further output to the IC arranged in the separable extensive accessory to complete the resetting action of the IC.

When the separable extensive accessory is pulled out of the portable device, the RST# signal of low state maintained originally by the GND (ground) side of the portable device will be pulled up to high state by the power source VCC through the first resistance R1, such that a state transition is generated and output. The first reverser U1 will reverse the state transition to drive the resetting device 60. Now, RST is in low state. Because of the characteristic of the transient short-circuit of the first capacitance C1, RST_1 is transited to negative voltage transiently to make the transistor Q1 cut off. Because of the characteristic of the transient short-circuit of the third capacitance C3, the voltage of current RESET# will be pulled down to low state. Next, the voltage of the RESET# will raise to high state gradually by following the charge, of the second capacitance C2, executed by the power s ource VCC through the third resistance R3, such that a resetting signal of low state is completed. The resetting signal of low state may be further output to the IC arranged in the separable extensive accessory to complete the resetting action of the IC.

As described in the first and second embodiments, if the IC arranged in the separable extensive accessory may execute the resetting action only by the resetting signal of high state, then a second reverser U2 may be added at the resetting signal outputting side in the resetting signal generating circuit 90 to change the resetting signal of low sate into the resetting signal of high state.

Consequently, in the present embodiment, the resetting device disclosed by the invention will all generate resetting signal when the separable extensive accessory is inserted into the external portable device and when the separable extensive accessory is pulled out of the external portable device.

In summary, the invention discloses a resetting device, for separable extensive accessory, characterized in: with a simple logic circuit, when the separable extensive accessory is pulled out/inserted in the portable device, a resetting action in the IC arranged in the extensive accessory will be completed. Consequently, the invention has deep progressiveness of implementation in both objective and function and extremely possesses with application value, besides the application having been never seen in current market, so this patent application completely fulfills the merits of the patent law, according to the description of the spirits of patent law.

What is claimed is:

1. A resetting device, for a separable extensive accessory, being connected between an external portable device and an IC arranged in the separable extensive accessory, the resetting device comprising:
an input buffering circuit connected to a power source and connected to the external portable device by a detachable manner, and generating a signal state transition in corresponding to the change of the connecting relationship between the separable extensive accessory and the portable device, the input buffering circuit having a first reverser and a first resistance:
an impulse generating circuit connected to the input buffering circuit for receiving the signal state transition and outputting an impulse signal; and
a resetting signal generating circuit connected to the power source and the impulse generating circuit and receiving the impulse signal and outputting a resetting signal to the IC.

2. The resetting device according to claim 1, further comprising:
a reset deciding circuit connected to the impulse generating circuit for deciding if the impulse generating circuit generates the impulse signal.

3. The resetting device according to claim 2, wherein the reset deciding circuit making the impulse generating circuit generate a impulse signal when the separable extensive accessory is inserted into the external portable device and making the impulse generating circuit unable to generate any impulse signal when the separable extensive accessory is pulled out of the external portable device, such that the resetting signal generating circuit will generate a resetting signal when the separable extensive accessory is inserted into the external portable device and will not generate any resetting signal when the separable extensive accessory is pulled out of the external portable device.

4. The resetting device according to claim 3, wherein the first reverser, which is connected to the power source, and of which input side is the input side of the input buffering circuit, and of which output side is the output side of the input buffering circuit; and
the first resistance, which is connected between the power source and the input side of the first reverser.

5. The resetting device according to claim 4, wherein the impulse generating circuit comprising:
a first capacitance, of which the first side is connected to the output side of the first reverser;
a second resistance, of which the first side is connected to the second side of the first capacitance, and of which the second side is grounded; and
a first transistor, which is a N-channel MOSFET, and of which the gate side is connected to the second side of the first capacitance, and of which the source side is grounded.

6. The resetting device according to claim 5, wherein the resetting signal generating circuit comprising:
a third resistance, of which the first side is connected to the power source, and of which the second side is connected to the draw side of the first transistor;
a second capacitance, of which the first side is connected to the second side of the third resistance, and of which the second side is grounded; and
a resetting signal outputting side, which is located between the third resistance and the second capacitance for outputting the resetting signal.

7. The resetting device according to claim 6, wherein the resetting signal generating circuit further comprising:
a second reverser to the resetting signal outputting side.

8. The resetting device according to claim 5, wherein the reset deciding circuit comprising:
a second transistor, which is a N-channel MOSFET, and of which the gate side is connected to the input side of the first reverser, and of which the draw side is connected to the second side of the first transistor, and of which the source side is grounded.

9. The resetting device according to claim 5, wherein the impulse generating circuit further comprising:
a fourth resistance that is connected between the first side of the first capacitance and the output side of the first reverser.

10. The resetting device according to claim 2, wherein the reset deciding circuit making the impulse generating circuit unable to generate any impulse signal when the separable extensive accessory is inserted into the external portable device and making the impulse generating circuit generate an impulse signal when the separable extensive accessory is pulled out of the external portable device, such that the resetting signal generating circuit will not generate any resetting signal when the separable extensive accessory is inserted into the external portable device and will generate a resetting signal when the separable extensive accessory is pulled out of the external portable device.

11. The resetting device according to claim 10, wherein the first reverser, which is connected to the power source, and of which input side is the input side of the input buffering circuit, and of which output side is the output side of the input buffering circuit; and the first resistance, which is connected between the power source and the input side of the first reverser.

12. The resetting device according to claim 11, wherein the impulse generating circuit comprising:

a first capacitance, of which the first side is connected to the output side of the first reverser;

a second resistance, of which the first side is connected to the second side of the first capacitance, and of which the second side is grounded;

a first transistor, which is a N-channel MOSFET, and of which the gate side is connected to the second side of the first capacitance, and of which the source side is grounded; and a third capacitance, of which the first side is connected to the second side of the first capacitance, and of which the second side is connected to the draw side of the first transistor.

13. The resetting device according to claim 12, wherein the resetting signal generating circuit comprising:

a third resistance, of which the first side is connected to the power source, and of which the second side is connected to the draw side of the first transistor;

a second capacitance, of which the first side is connected to the second side of the third resistance, and of which the second side is grounded; and a resetting signal outputting side, which is located between the third resistance and the second capacitance for outputting the resetting signal.

14. The resetting device according to claim 13, wherein the resetting signal generating circuit further comprising:

a second reverser to the resetting signal outputting side.

15. The resetting device according to claim 12, wherein the reset deciding circuit comprising:

a second transistor, which is a N-channel MOSFET, and of which the gate side is connected to the output side of the input buffering circuit, and of which the draw side is connected to the second side of the first transistor, and of which the source side is grounded.

16. The resetting device according to claim 12, wherein the impulse generating circuit further comprising:

a fourth resistance that is connected between the first side of the first capacitance and the output side of the first reverser.

17. The resetting device according to claim 1, wherein the resetting signal generating circuit generating a resetting signal when the separable extensive accessory is inserted into the external portable device and generating a resetting signal when the separable extensive accessory is pulled out of the external portable device.

18. The resetting device according to claim 17, the first reverser, which is connected to the power source, and of which input side is the input side of the input buffering circuit, and of which output side is the output side of the input buffering circuit; and the first resistance, which is connected between the power source and the input side of the first reverser.

19. The resetting device according to claim 18, wherein the impulse generating circuit comprising:

a first capacitance, of which the first side is connected to the output side of the first reverser;

a second resistance, of which the first side is connected to the second side of the first capacitance, and of which the second side is grounded;

a first transistor, which is a N-channel MOSFET, and of which the gate side is connected to the second side of the first capacitance, and of which the source side is grounded; and a third capacitance, of which the first side is connected to the second side of the first capacitance, and of which the second side is connected to the draw side of the first transistor.

20. The resetting device according to claim 19, wherein the impulse generating circuit further comprising:

a fourth resistance that is connected between the first side of the first capacitance and the output side of the first reverser.

21. The resetting device according to claim 19, wherein the resetting signal generating circuit comprising:

a third resistance, of which the first side is connected to the power source, and of which the second side is connected to the draw side of the first transistor;

a second capacitance, of which the first side is connected to the second side of the third resistance, and of which the second side is grounded; and a resetting signal outputting side, which is located between the third resistance and the second capacitance for outputting the resetting signal.

22. The resetting device according to claim 21, wherein the resetting signal generating circuit further comprising:

a second reverser to the resetting signal outputting side.

* * * * *